United States Patent
Jhang et al.

(10) Patent No.: US 10,181,475 B2
(45) Date of Patent: Jan. 15, 2019

(54) THREE-DIMENSIONAL NON-VOLATILE MEMORY AND MANUFACTURING METHOD THEREOF

(71) Applicant: MACRONIX International Co., Ltd., Hsinchu (TW)

(72) Inventors: Pei-Ci Jhang, Hsinchu (TW); Chi-Pin Lu, Hsinchu (TW); Jung-Yu Shieh, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 15/294,338

(22) Filed: Oct. 14, 2016

(65) Prior Publication Data
US 2018/0019254 A1   Jan. 18, 2018

(30) Foreign Application Priority Data
Jul. 12, 2016  (TW) .............................. 105121852 A

(51) Int. Cl.
| | |
|---|---|
| *H01L 21/00* | (2006.01) |
| *H01L 27/11568* | (2017.01) |
| *H01L 27/11582* | (2017.01) |
| *H01L 27/1157* | (2017.01) |

(52) U.S. Cl.
CPC .... *H01L 27/11568* (2013.01); *H01L 27/1157* (2013.01); *H01L 27/11582* (2013.01)

(58) Field of Classification Search
CPC ..................... H01L 27/11568; H01L 27/11582
See application file for complete search history.

(56) References Cited

U.S. PATENT DOCUMENTS

| | | | | |
|---|---|---|---|---|
| 9,324,789 B1* | 4/2016 | Wu | ..................... | H01L 29/0649 |
| 9,466,610 B1* | 10/2016 | Yang | .................. | H01L 27/11582 |
| 9,748,171 B2* | 8/2017 | Chen | .................. | H01L 27/11521 |
| 10,002,879 B2* | 6/2018 | Jiang | .................. | H01L 27/11582 |
| 2016/0141299 A1* | 5/2016 | Hong | ................. | H01L 27/11578 257/324 |
| 2016/0260732 A1* | 9/2016 | Lue | .................... | H01L 27/11582 |

(Continued)

FOREIGN PATENT DOCUMENTS

| | | | | |
|---|---|---|---|---|
| CN | 107611129 A | * | 1/2018 | ........ H01L 27/11568 |
| TW | 201244007 | | 11/2012 | |

(Continued)

OTHER PUBLICATIONS

"Office Action of Taiwan Counterpart Application," dated Jul. 28, 2017, p. 1-p. 6, in which the listed references were cited.

*Primary Examiner* — Laura M Menz
(74) *Attorney, Agent, or Firm* — J.C. Patents

(57) ABSTRACT

A three-dimensional non-volatile memory including a substrate, a stacked structure and a channel layer. The stacked structure is disposed on the substrate and includes first dielectric layers, gates and charge storage structures. The first dielectric layers and the gates are alternately stacked. The charge storage structures are disposed at one side of the gates. Two adjacent charge storage structures are isolated by the first dielectric layer therebetween. Each of the charge storage structures includes a first oxide layer, a nitride layer and a second oxide layer sequentially disposed at one side of each of the gates. The channel layer is disposed on a sidewall of the stacked structure adjacent to the charge storage structures.

16 Claims, 7 Drawing Sheets

(56) References Cited

U.S. PATENT DOCUMENTS

| | | | |
|---|---|---|---|
| 2016/0260733 A1* | 9/2016 | Lue | H01L 27/11582 |
| 2016/0284725 A1* | 9/2016 | Yang | H01L 27/11582 |
| 2017/0092632 A1* | 3/2017 | Chen | H01L 27/11521 |
| 2017/0194340 A1* | 7/2017 | Lue | H01L 27/11556 |
| 2017/0294444 A1* | 10/2017 | Jiang | H01L 27/11582 |
| 2018/0019254 A1* | 1/2018 | Jhang | H01L 27/11568 |

FOREIGN PATENT DOCUMENTS

| | | | |
|---|---|---|---|
| TW | 201428895 | 7/2014 | |
| WO | WO 2014077972 A1 * | 5/2014 | H01L 27/11556 |
| WO | WO-2014077972 A1 * | 5/2014 | H01L 27/11556 |

\* cited by examiner

THREE-DIMENSIONAL NON-VOLATILE MEMORY AND MANUFACTURING METHOD THEREOF

CROSS-REFERENCE TO RELATED APPLICATION

This application claims the priority benefit of Taiwan application serial no. 105121852, filed on Jul. 12, 2016. The entirety of the above-mentioned patent application is hereby incorporated by reference herein and made a part of this specification.

BACKGROUND OF THE INVENTION

Field of the Invention

The invention relates to a memory, and particularly relates to a three-dimensional non-volatile memory.

Description of Related Art

Since a non-volatile memory device (e.g., flash memory) has the advantages that stored data does not disappear after power failure, it becomes a widely used memory device for personal computers and electronic equipments.

Currently, flash memory arrays commonly used in the industry include NOR flash memory and NAND flash memory. Since the non-volatile memory structure of NAND flash memory is to connect each of memory cells together in series, degree of integration and area utilization thereof is better than NOR flash memory. Thus, the NAND flash memory has been widely used in a variety of electronic products.

Additionally, to further enhance the degree of integration of the memory device, three-dimensional NAND flash memory is developed. However, since charge storage structures of the memory cells connected in series in current three-dimensional NAND flash memory are structures connected to each other continuously, an interference phenomenon is often generated between the memory cells during operation.

SUMMARY OF THE INVENTION

The invention provides a three-dimensional non-volatile memory and a manufacturing method thereof, which can improve the interference phenomenon between the memory cells during operation.

The invention provides a three-dimensional non-volatile memory including a substrate, a stacked structure and a channel layer. The stacked structure is disposed on the substrate and includes first dielectric layers, gates and charge storage structures. The first dielectric layers and the gates are alternately stacked. The charge storage structures are disposed at one side of the gates. Two adjacent charge storage structures are isolated by the first dielectric layer therebetween. Each of the charge storage structures includes a first oxide layer, a nitride layer and a second oxide layer sequentially disposed at one side of each of the gates. The channel layer is disposed on a sidewall of the stacked structure adjacent to the charge storage structures.

According to an embodiment of the invention, in the three-dimensional non-volatile memory, a material of the first dielectric layer is silicon oxide, for example.

According to an embodiment of the invention, in the three-dimensional non-volatile memory, a material of the first oxide layer is silicon oxide or silicon oxynitride, for example.

According to an embodiment of the invention, in the three-dimensional non-volatile memory, a material of the second oxide layer is silicon oxide or silicon oxynitride, for example.

According to an embodiment of the invention, in the three-dimensional non-volatile memory, a material of the channel layer is a semiconductor material, for example.

According to an embodiment of the invention, the three-dimensional non-volatile memory further includes a second dielectric layer. The second dielectric layer is disposed at one side of the channel layer away from the stacked structure.

According to an embodiment of the invention, the three-dimensional non-volatile memory further includes a conductor layer. The conductor layer is connected to an upper portion of the channel layer.

According to an embodiment of the invention, in the three-dimensional non-volatile memory, the stacked structure further includes a buffer layer. The buffer layer is disposed between each of the gates and each of the charge storage structures.

According to an embodiment of the invention, in the three-dimensional non-volatile memory, a material of the buffer layer is a high dielectric constant material, for example.

According to an embodiment of the invention, in the three-dimensional non-volatile memory, the stacked structure further includes a barrier layer. The barrier layer is disposed between each of the gates and the buffer layer.

According to an embodiment of the invention, in the three-dimensional non-volatile memory, a material of the barrier layer is a work function metal material, for example.

The invention provides a manufacturing method of a three-dimensional non-volatile memory including the following steps. A stacked structure is formed on a substrate. The stacked structure includes first dielectric layers, gates and charge storage structures. The first dielectric layers and the gates are alternately stacked. The charge storage structures are disposed at one side of the gates. Two adjacent charge storage structures are isolated by the first dielectric layer therebetween. Each of the charge storage structures includes a first oxide layer, a nitride layer and a second oxide layer sequentially disposed at one side of each of the gates. A channel layer is formed on a sidewall of the stacked structure adjacent to the charge storage structures.

According to an embodiment of the invention, in the manufacturing method of the three-dimensional non-volatile memory, a method for forming the stacked structure includes the following steps. First dielectric material layers and silicon nitride material layers alternately stacked are formed on the substrate. A first patterning process is performed on the first dielectric material layers and the silicon nitride material layers to form a first opening. A first oxidation process is perforr red on the silicon nitride material layers exposed by the first opening, such that a portion of the silicon nitride material layers exposed by the first opening is changed into the second oxide layers. A second patterning process is performed on the first dielectric material layers and the silicon nitride material layers to form a second opening. A portion of the silicon nitride material layers exposed by the second opening are removed to form third openings. A second oxidation process is performed on the silicon nitride material layers exposed by the third openings, such that a portion of the silicon nitride material layers exposed by the third openings are changed into the first oxide layers, and the nitride layers are formed from a remaining portion of the silicon nitride material layers. The gates filled in the third openings are formed.

According to an embodiment of the invention, in the manufacturing method of the three-dimensional non-volatile memory, the first oxidation process is a remote plasma oxidation process, for example.

According to an embodiment of the invention, in the manufacturing method of the three-dimensional non-volatile memory, a method for removing the portion of the silicon nitride material layers exposed by the second opening is a wet etching method, for example.

According to an embodiment of the invention, in the manufacturing method of the three-dimensional non-volatile memory, the second oxidation process is a remote plasma oxidation process, for example.

According to an embodiment of the invention, the manufacturing method of the three-dimensional non-volatile memory further includes forming a second dielectric layer at one side of the channel layer away from the stacked structure.

According to an embodiment of the invention, the manufacturing method of the three-dimensional non-volatile memory further includes forming a conductor layer connected to an upper portion of the channel layer.

According to an embodiment of the invention, the manufacturing method of the three-dimensional non-volatile memory further includes forming a buffer layer between each of the gates and each of the charge storage structures.

According to an embodiment of the invention, the manufacturing method of the three-dimensional non-volatile memory further includes forming a barrier layer between each of the gates and the buffer layer.

Based on the above, in the three-dimensional non-volatile memory and the manufacturing method thereof provided by the invention, since two adjacent charge storage structures are isolated by the first dielectric layer therebetween, the interference phenomenon between the memory cells during operation can be improved.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
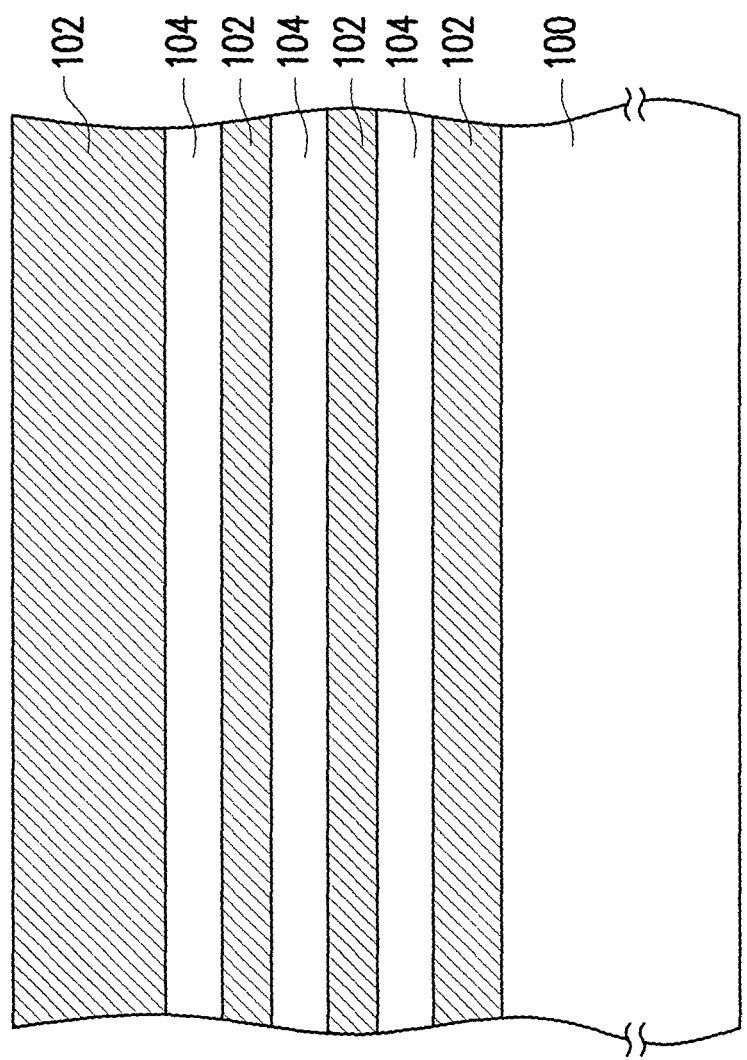
FIG. 1A to FIG. 1G are cross-sectional views illustrating a manufacturing process of a three-dimensional non-volatile memory according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1A to FIG. 1G are cross-sectional views illustrating a manufacturing process of a three-dimensional non-volatile memory according to an embodiment of the invention.

Referring to FIG. 1A, dielectric material layers 102 and silicon nitride material layers 104 alternately stacked are foinied on a substrate 100. A person having ordinary skill in the art may form doped regions (for example, an N+ doped region) (not shown) in the substrate 100 according to the product design requirements. A material of the dielectric material layer 102 is silicon oxide, for example. The dielectric material layers 102 and the silicon nitride material layers 104 are respectively formed by a chemical vapor deposition (CVD), for example.

Figure 1B:
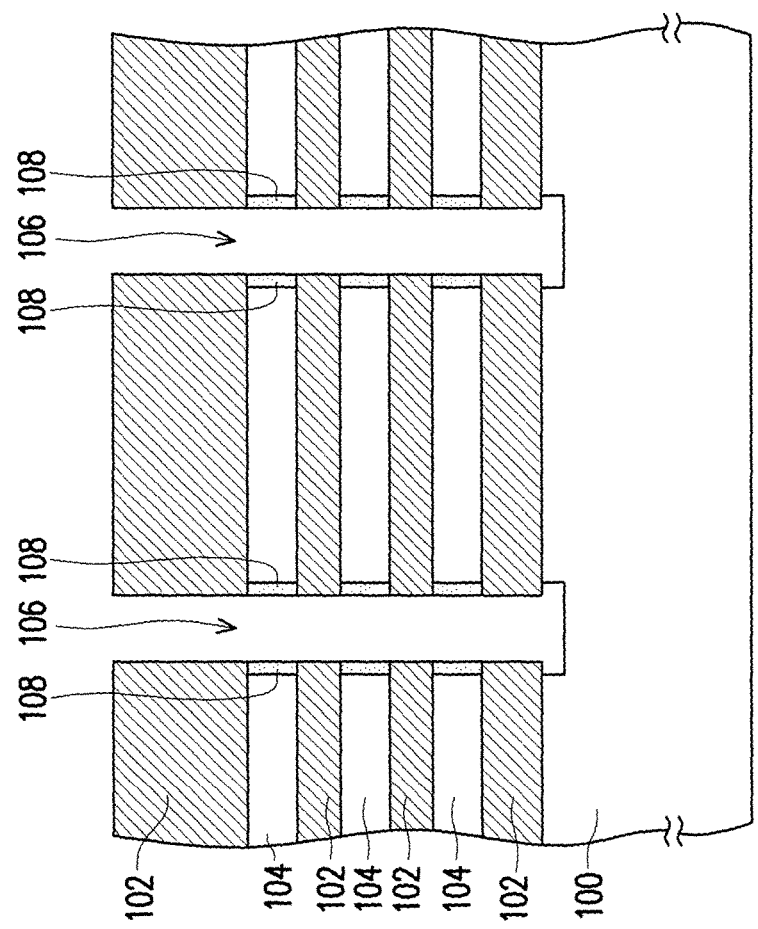

Referring to FIG. 1B, a patterning process is performed on the dielectric material layers 102 and the silicon nitride material layers 104 to form an opening 106.

In the patterning process, a portion of the substrate 100 can be selectively removed, so that the opening 106 is extended into the substrate 100.

An oxidation process is performed on the silicon nitride material layers 104 exposed by the first opening 106, such that a portion of the silicon nitride material layers 104 exposed by the first opening 106 are changed into oxide layers 108. A material of the oxide layer 108 is silicon oxide or silicon oxynitride, for example. When the material of the oxide layer 108 is silicon oxynitride, the oxide layer 108 can provide better programming characteristics. The oxidation process is a remote plasma oxidation process, for example. Even in a structure with a high aspect ratio, when the oxide layer 108 is formed by the remote plasma oxidation process, the oxide layer 108 can still have better uniformity and film-forming quality, and the oxide layer 108 and the silicon nitride material layer 104 have a better interface therebetween.

Figure 1C:
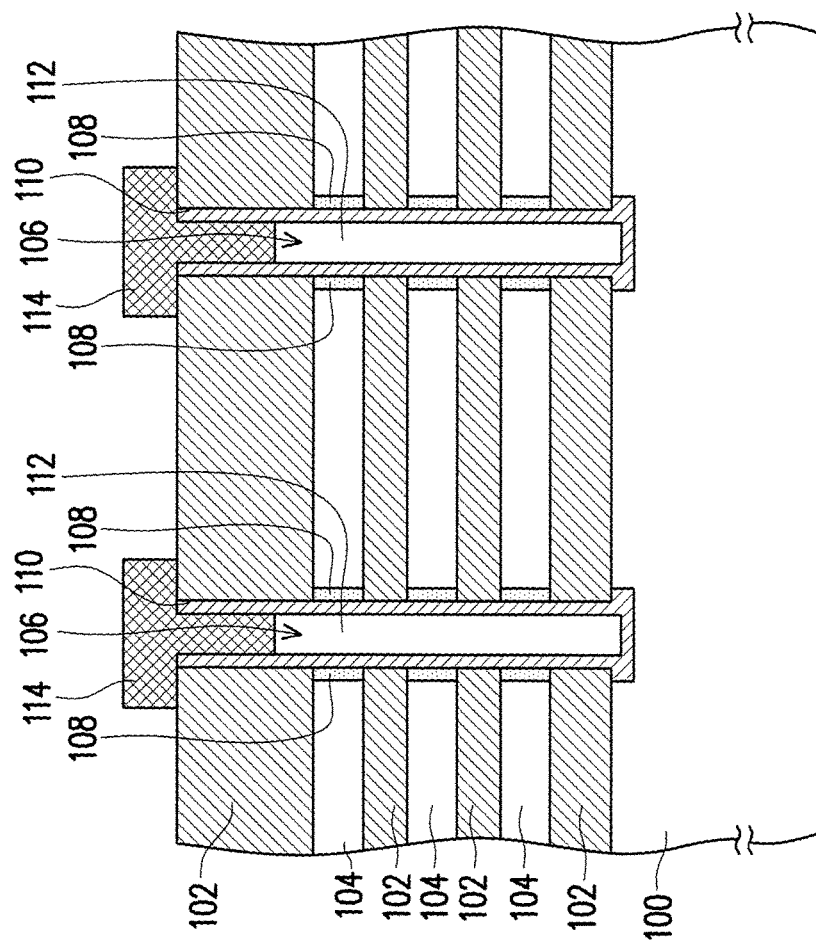

Referring to FIG. 1C, a channel layer 110 is formed on a surface of the opening 106. A material of the channel layer 110 is a semiconductor material, such as polysilicon. A method for forming the channel layer 110 is a chemical vapor deposition (CVD), for example.

A dielectric layer 112 filled in the opening 106 is formed. A material of the dielectric layer 112 is silicon oxide or a spin on dielectric (SOD) material, for example. A method for forming the dielectric layer 112 is to form a dielectric material layer (not shown) filled in the opening 106 by a chemical vapor deposition (CVD) or a spin-coating method, and then an etching back process is performed on the dielectric material layer, for example.

A conductor layer 114 connected to an upper portion of the channel layer 110 is formed. A material of the conductor layer 114 is a conductor material, such as doped polysilicon. A method for forming the conductor layer 114 is to form a conductor material layer (not shown) filled in the opening 106 by a chemical vapor deposition (CVD), and then a patterning process is performed on the conductor material layer, for example.

Figure 1D:
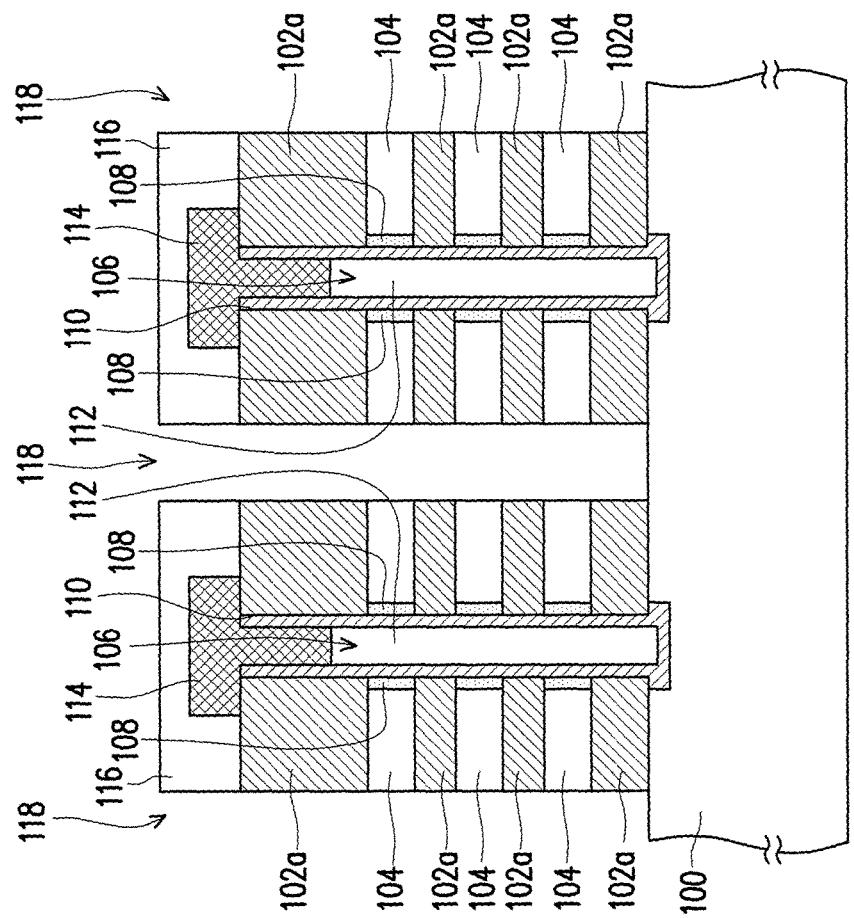

Referring to FIG. 1D, a dielectric layer 116 covering the conductor layer 114 may be formed. A material of the dielectric layer 116 is silicon oxide, for example. A method for foirning the dielectric layer 116 is a chemical vapor deposition (CVD), for example.

A patterning process is performed on the dielectric layer 116, the dielectric material layers 102 and the silicon nitride material layers 104 to form an opening 118. After performing the patterning process on the dielectric material layers 102, dielectric layers 102a are formed from a remaining portion of the dielectric material layers 102.

Figure 1E:
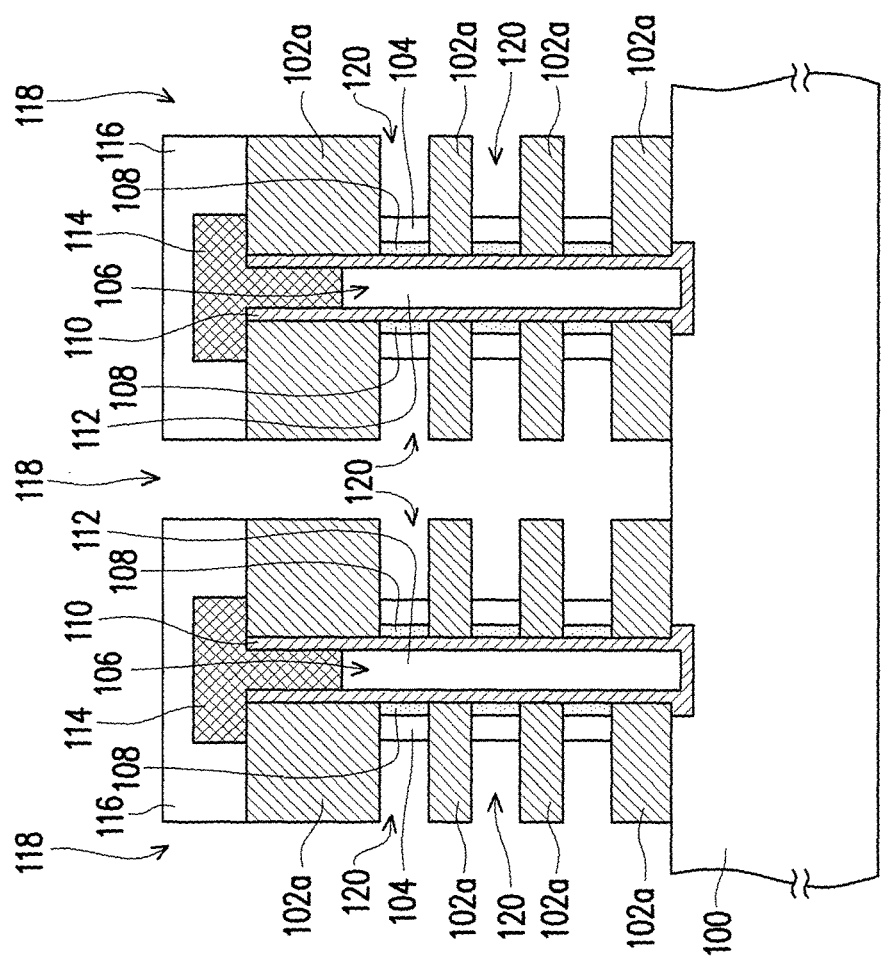

Referring to FIG. 1E, a portion of the silicon nitride material layers 104 exposed by the opening 118 are removed to form openings 120. A method for removing the portion of the silicon nitride material layers 104 exposed by the opening 118 is a wet etching method, for example. An etchant used by the wet etching method is phosphoric acid ($H_3PO_4$), for example.

Figure 1F:
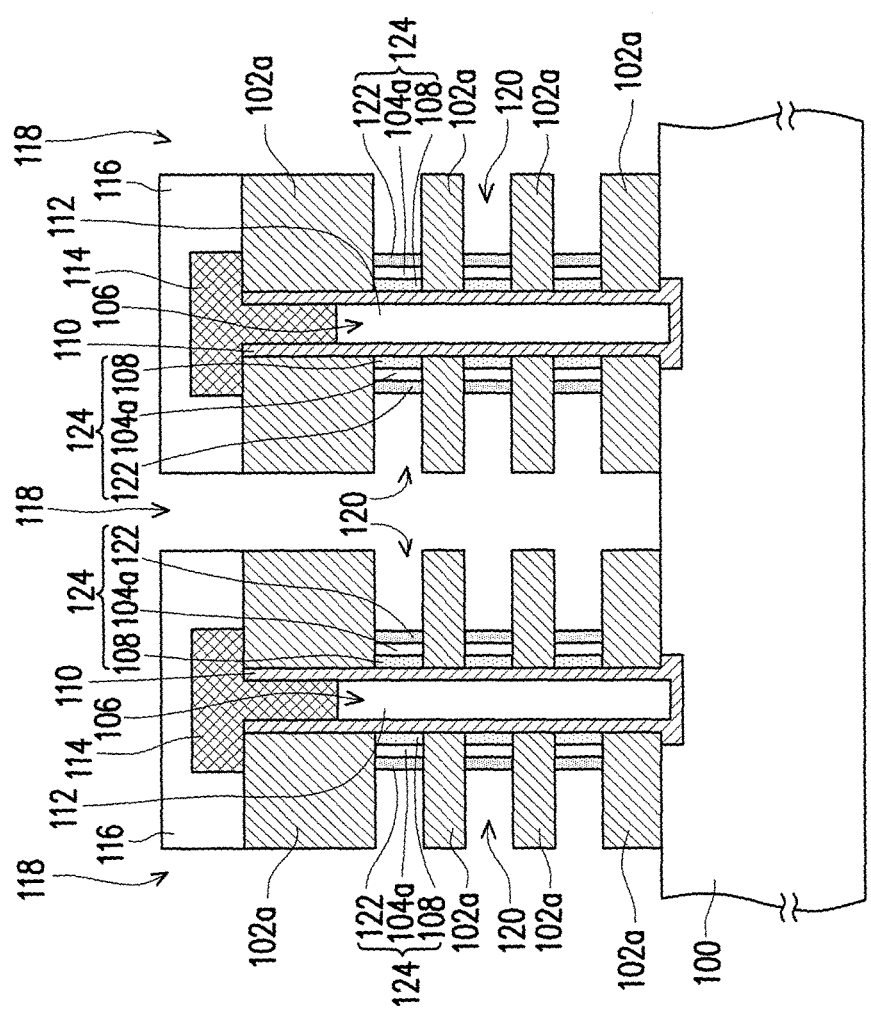

Referring to FIG. 1F, an oxidation process is performed on the silicon nitride material layers 104 exposed by the openings 120, such that a portion of the silicon nitride material layers 104 exposed by the openings 120 are changed into the oxide layers 122, and the nitride layers 104a are formed from a remaining portion of the silicon nitride material layers 104. The nitride layer 104a can be used as a charge storage layer. A material of the oxide layer 122 is silicon oxide or silicon oxynitride, for example. When the material of the oxide layer 122 is silicon oxide, the oxide layer 122 can provide better erasing characteristics. The oxidation process is a remote plasma oxidation process, for example. Even in a structure with a high aspect ratio, when the oxide layer 122 is for lied by the remote plasma oxidation process, the oxide layer 122 can still have better unifoimity and film-forming quality, and the oxide layer 122 and the nitride layer 104a have a better interface therebetween.

Additionally, a charge storage structure 124 can be formed form the oxide layer 122, the nitride layer 104a and the oxide layer 108. The forming sequence and method of the oxide layer 122, the nitride layer 104a and the oxide layer 108 in the charge storage structure 124 of the embodiment are different from that of the oxide layer, the nitride layer and the oxide layer (ONO) in the charge storage structure of a traditional three-dimensional non-volatile memory. Additionally, by the method of the embodiment to manufacture the charge storage structure 124, the process steps can be effectively reduced, thereby reducing the complexity of the process.

Figure 1G:
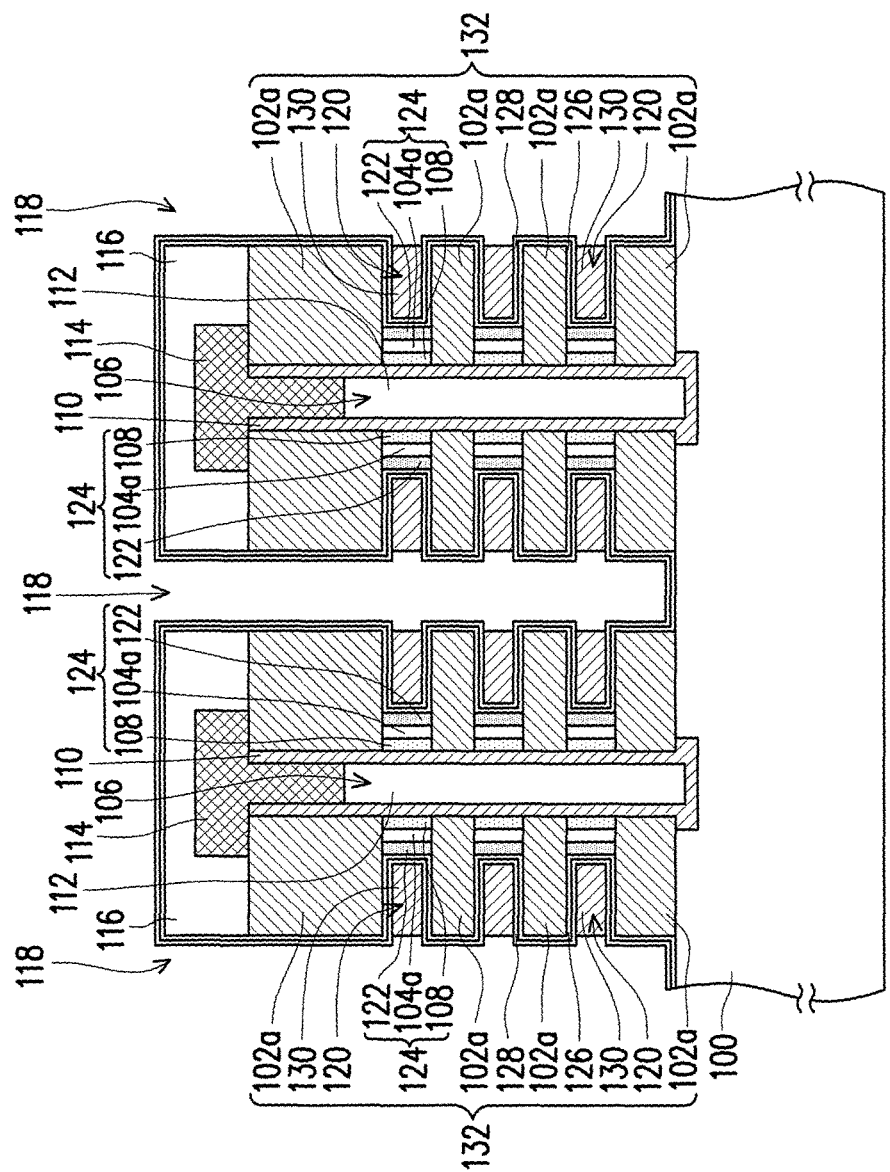

Referring to FIG. 1G, a buffer layer 126 may be selectively formed in the opening 120. The buffer layer 126 may be used to improve erasing characteristics. A material of the buffer layer 126 is a high dielectric constant material, such as aluminum oxide. A method for forming the buffer layer 126 is an atomic layer deposition (ALD), for example.

A barrier layer 128 may be selectively formed on the buffer layer 126. A material of the barrier layer 128 is a work function metal material, such as TiN. A method for forming the barrier layer 128 is a chemical vapor deposition (CVD), for example.

A gate 130 filled in the opening 120 is formed. A material of the gate 130 is a conductor material, such as tungsten. A method for forming the gate 130 is to form a gate material layer (not shown) filled in the opening by a chemical vapor deposition (CVD), and then the gate material layer outside the opening 120 is removed by a wet etching method, for example.

In FIG. 1G, although the barrier layer 128 and the buffer layer 126 outside the opening 120 are maintained, a person having ordinary skill in the art can further selectively remove the barrier layer 128 and the buffer layer 126 outside the opening 120 in the following process after the gate 130 is formed.

Additionally, a stacked structure 132 may be formed from the dielectric layers 102a, the gates 130 and the charge storage structures 124. Moreover, the stacked structure 132 may further selectively include at least one of the buffer layer 126 and the barrier layer 128. In the embodiment, the method for forming the stacked structure 132 is described by the above method as an example; however, the method for forming the stacked structure 132 of the invention is not limited thereto.

Based on the above embodiments, in the manufacturing method of the three-dimensional non-volatile memory, since two adjacent charge storage structures 124 are isolated by the dielectric layer 102a therebetween, the interference phenomenon between the memory cells during operation can be improved.

Hereinafter, the three-dimensional non-volatile memory of the embodiment is described by FIG. 1G. Additionally, the manufacturing method of the three-dimensional non-volatile memory of the embodiment is described by the above method as an example; however, the manufacturing method of the three-dimensional non-volatile memory of the invention is not limited thereto.

Referring to FIG. 1G, the three-dimensional non-volatile memory includes the substrate 100, the stacked structure 132 and the channel layer 110. The stacked structure 132 is disposed on the substrate 100 and includes dielectric layers 102a, gates 130 and charge storage structures 124. The dielectric layers 102a and the gates 130 are alternately stacked. The charge storage structures 124 are disposed at one side of the gates 130. Two adjacent charge storage structures 124 are isolated by the dielectric layer 102a therebetween. Each of the charge storage structures 124 includes the oxide layer 122, the nitride layer 104a and the oxide layer 108 sequentially disposed at one side of each of the gates 130. The stacked structure 132 may further selectively include at least one of the buffer layer 126 and the barrier layer 128. The buffer layer 126 is disposed between each of the gates 130 and each of the charge storage structures 124. The barrier layer 128 is disposed between each of the gates 130 and the buffer layer 126. The channel layer 110 is disposed on a sidewall of the stacked structure 132 adjacent to the charge storage structures 124.

Additionally, the three-dimensional non-volatile memory may selectively include at least one of the dielectric layer 112 and the conductor layer 114. The dielectric layer 112 is disposed at one side of the channel layer 110 away from the stacked structure 132. The conductor layer 114 is connected to an upper portion of the channel layer 110.

Additionally, the material, the arrangement manner, the forming method, and the efficacy of each of the components in the three-dimensional non-volatile memory have been illustrated in detail in the aforementioned manufacturing method of FIG. 1A to FIG. 1G, and thus it will not be repeated herein.

In summary, in the three-dimensional non-volatile memory and the manufacturing method thereof in the embodiment, since two adjacent charge storage structures are isolated by the dielectric layer therebetween, the interference phenomenon between the memory cells during operation can be improved.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A three-dimensional non-volatile memory, comprising:
a substrate;
stacked structures, disposed on the substrate, wherein each of the stacked structures comprises:
first dielectric layers and gates, wherein the first dielectric layers and the gates are alternately stacked; and
charge storage structures, disposed at one side of the gates, two adjacent charge storage structures being isolated by the first dielectric layer therebetween, wherein each of the charge storage structures comprises a first oxide layer, a nitride layer and a second oxide layer sequentially disposed at one side of each of the gates, and a first opening is disposed between the stacked structures;

a channel layer, conformally disposed on a sidewall of each of the stacked structures adjacent to the charge storage structures;

a second dielectric layer, disposed within the channel layer; and a conductor layer, connected to an upper portion of the channel layer, wherein the first opening is filled by the conductor layer, and a portion of top surfaces of the stacked structures is covered by the conductor layer.

2. The three-dimensional non-volatile memory according to claim 1, wherein a material of the first dielectric layer comprises silicon oxide.

3. The three-dimensional non-volatile memory according to claim 1, wherein a material of the first oxide layer comprises silicon oxide or silicon oxynitride.

4. The three-dimensional non-volatile memory according to claim 1, wherein a material of the second oxide layer comprises silicon oxide or silicon oxynitride.

5. The three-dimensional non-volatile memory according to claim 1, wherein a material of the channel layer comprises a semiconductor material.

6. The three-dimensional non-volatile memory according to claim 1, further comprising a buffer layer, disposed between each of the gates and each of the charge storage structures.

7. The three-dimensional non-volatile memory according to claim 6, wherein a material of the buffer layer comprises a high dielectric constant material.

8. The three-dimensional non-volatile memory according to claim 6, further comprising a barrier layer, disposed between each of the gates and the buffer layer.

9. The three-dimensional non-volatile memory according to claim 8, wherein a material of the barrier layer comprises a work function metal material.

10. A manufacturing method of a three-dimensional non-volatile memory, comprising:
    forming stacked structures on a substrate, wherein each of the stacked structures comprises:
    first dielectric layers and gates, wherein the first dielectric layers and the gates are alternately stacked; and
    charge storage structures, disposed at one side of the gates, two adjacent charge storage structures being isolated by the first dielectric layer therebetween, wherein each of the charge storage structures comprises a first oxide layer, a nitride layer and a second oxide layer sequentially disposed at one side of each of the gates, and a first opening is disposed between the stacked structures;
    forming a channel layer conformally on a sidewall of the stacked structures adjacent to the charge storage structures;
    forming a second dielectric layer within the channel layer; and
    forming a conductor layer connected to an upper portion of the channel layer, wherein the first opening is filled by the conductor layer, and a portion of top surfaces of the stacked structures is covered by the conductor layer.

11. The manufacturing method of the three-dimensional non-volatile memory according to claim 10, wherein a method for forming each of the stacked structures comprises:
    forming first dielectric material layers and silicon nitride material layers alternately stacked on the substrate;
    performing a first patterning process on the first dielectric material layers and the silicon nitride material layers to form a first opening;
    performing a first oxidation process on the silicon nitride material layers exposed by the first opening to change a portion of the silicon nitride material layers exposed by the first opening into the second oxide layers;
    performing a second patterning process on the first dielectric material layers and the silicon nitride material layers to form a second opening;
    removing a portion of the silicon nitride material layers exposed by the second opening to form third openings;
    performing a second oxidation process on the silicon nitride material layers exposed by the third openings to change a portion of the silicon nitride material layers exposed by the third openings into the first oxide layers, and forming the nitride layers from a remaining portion of the silicon nitride material layers; and
    forming the gates filled in the third openings.

12. The manufacturing method of the three-dimensional non-volatile memory according to claim 11, wherein the first oxidation process comprises a remote plasma oxidation process.

13. The manufacturing method of the three-dimensional non-volatile memory according to claim 11, wherein a method for removing the portion of the silicon nitride material layers exposed by the second opening comprises a wet etching method.

14. The manufacturing method of the three-dimensional non-volatile memory according to claim 11, wherein the second oxidation process comprises a remote plasma oxidation process.

15. The manufacturing method of the three-dimensional non-volatile memory according to claim 10, further comprising forming a buffer layer between each of the gates and each of the charge storage structures.

16. The manufacturing method of the three-dimensional non-volatile memory according to claim 15, further comprising forming a barrier layer between each of the gates and the buffer layer.

* * * * *